US007026652B2

(12) United States Patent
Konno et al.

(10) Patent No.: US 7,026,652 B2
(45) Date of Patent: Apr. 11, 2006

(54) SEMICONDUCTOR LIGHT EMITTING DIODE

(75) Inventors: Kuniaki Konno, Kanagawa (JP); Junichi Fujiki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 10/673,640

(22) Filed: Sep. 26, 2003

(65) Prior Publication Data

US 2004/0119078 A1 Jun. 24, 2004

(30) Foreign Application Priority Data

Sep. 30, 2002 (JP) ............................ 2002-286996

(51) Int. Cl.
*H01L 27/15* (2006.01)

(52) U.S. Cl. ............................ 257/79; 257/59; 257/78

(58) Field of Classification Search .................. 257/79
See application file for complete search history.

(56) References Cited

U.S. PATENT DOCUMENTS 5,793,062 A 8/1998 Kish et al.
6,693,306 B1 * 2/2004 Chen et al. .................. 257/99
6,717,711 B1 * 4/2004 Lin et al. .................... 359/245
6,775,310 B1 * 8/2004 Sai et al. ................. 372/45.01
6,791,119 B1 * 9/2004 Slater et al. .................. 257/99
6,903,381 B1 * 6/2005 Lin et al. ..................... 257/99
2002/0185648 A1 12/2002 Furukawa et al.

* cited by examiner

*Primary Examiner*—Thao P. Le
(74) *Attorney, Agent, or Firm*—Hogan & Hartson, L.L.P.

(57) ABSTRACT

A power LED high in light extraction efficiency is obtained without increasing the operation voltage and degrading the reliability. The power LED comprises: epitaxial growth layers including a first conductive type clad layer, an active layer made of an InGaAlP compound semiconductor on said first conductive type clad layer to generate light, and a second conductive type clad layer formed on said active layer; and a transparent first conductive type GaP substrate made of GaP with a thickness of equal to or more than 150 μm and having a first surface, said first surface having an area equal to or wider than 0.1 $mm^2$ and bonded to a bonding surface of said first conductive type clad layer via no layer or via a bond layer, an area of said bonding surface of said first conductive type clad layer being smaller than said first surface of said substrate to locally expose said first surface or said bond layer.

20 Claims, 5 Drawing Sheets

SEMICONDUCTOR LIGHT EMITTING DIODE

CROSS-REFERENCE TO RELATED APPLICATIONS

This application is based upon and claims the benefits of priority from the prior Japanese Patent Application No. 2002-286996, filed on Sep. 30, 2002, the entire contents of which are incorporated herein by reference.

BACKGROUND OF THE INVENTION

1. Field of the Invention

The present invention relates to a light emitting diode and, in particular, to a high-power semiconductor light emitting diode (power LED).

2. Related Background Art

Semiconductor light emitting diodes are elements that use spontaneous emission of light that occurs in the course of recombination of injected carriers with holes in a region of a PN junction region when a forward current is supplied to the PN junction. Small-sized LEDs whose chip size does not exceed 300 μm in width and depth have heretofore used frequently as semiconductor light emitting diodes. This conventional structure LEDs has advantages of low power consumption, long lifetime, compactness and lightweight, etc., and they are widely used in various kinds of display devices and traffic lights. Especially in recent years, high luminance emission under a low current (around 20 mA) is requested for use as backlights of automobiles.

In general, semiconductor light emitting diodes can emit higher luminance light as the internal emission efficiency and the light extraction efficiency become higher and higher, respectively, the internal light emission efficiency representing the ratio of the radiative carrier recombination relative to the carrier recombination (radiative carrier recombination and non-radiative carrier recombination), and the light extraction efficiency representing the ratio of extracted light relative to light generated by the radiative carrier recombination. As being capable of obtaining large internal light emission efficiency, a structure using an InGaAlP compound semiconductor of a direct transition type as its active layer has been known. But, the InGaAlP compound semiconductor is formed on an opaque GaAs substrate. Under the circumstances, as a structure ensuring large external light extraction efficiency, a compact LED of a transparent substrate type has been brought into practical use, which is made by first making an InGaAlP compound semiconductor by crystal growth on a GaAs substrate, subsequently bonding a transparent GaP substrate and removing the opaque GaAs substrate. A conventional structure LED of this type is proposed, for example, in JP2001-57441A.

Recently, development of power LED is under progress. This power LED is a large-sized, high-power LED having an area of the top surface of the chip as large as 0.1 $mm^2$ or more. Its package is reduced in heat resistance, and a large current even beyond 50 mA can be supplied. This power LED is expected for its use as a substitution of light bulbs or in industrial machines, analytical instruments, medial apparatuses, and so on. Also, as such power LEDs, those of a transparent substrate type using an InGaAlP compound semiconductor as the active layer and bonding a transparent GaP substrate have been brought into practical use.

FIGS. 8 and 9 show a conventional power LED of the above-mentioned transparent substrate type. FIG. 8 is a cross-sectional view thereof, and FIG. 9 is a plan view. The substrate 501 has a width and a depth of approximately 550 μm, and the area of its inner surface A is approximately 0.3 $mm^2$. This is a large-sized LED. Sequentially formed on the transparent p-type GaP substrate 501 are: a p-type GaP bond layer 502; p-type InGaP bond layer 503; p-type clad layer 504 of InAlP; active layer 505 having a MQW structure including p-type InGaAlP; n-type clad layer 506 of InAlP; current diffusion layer 507 of n-type InGaAlP; and n-type contact layer 508 of GaAs. The p-type GaP bond layer 502 and the p-type InGaP bond layer 503 are formed by bonding, and a bonded interface is formed between them. A p-side ohmic electrode 510 is formed as one of electrodes under the p-type GaP substrate 501 when viewed in the figure. An n-side ohmic electrode 511 as the other of the electrodes is formed on the top when viewed in the figure. As to the actual thickness of this LED, thickness of the transparent electrode 501 (including the p-type GaP bond layer 50) is several hundreds of μm, and thickness of the epitaxial growth layers 503 through 508 is some μm. However, FIG. 8 illustrates it in a modified scale for easier explanation.

In the power LED shown in FIGS. 8 and 9, light generated in the active layer 505 is externally emitted from the top surface or side surface of the diode when viewed in the figure. In order to extract the light efficiently from the top surface, the opaque n-side ohmic electrode 511 is formed to occupy an area as small as shown in FIG. 9. The power LED of the transparent substrate type formed in this manner is enhanced in external light extraction efficiency and can emit light of higher luminance than diodes formed on opaque GaAs substrates.

A power LED higher in light extraction efficiency than the conventional power LED, if any, will be effectively useful for various purposes, such as the use as a substitution of light bulbs as mentioned above, for example. However, the power LED is scheduled for use under a high current, reduction in operation voltage is extremely important. Heretofore, it has been the general recognition that enhancement of the external light extraction efficiency without inviting an increase of the operation voltage is usually difficult. Consequently, it has been considered extremely difficult to enhance the light extraction efficiency of the conventional power LED further more.

That is, the effort of enhancing the light extraction efficiency in compact conventional structure LEDs heretofore relied on diminishing the electrode or etching the diode to an appropriate configuration. However, this approach by diminishing the electrode or etching the diode may cause an increase of the operation voltage. Conventional structure LEDs, however, are used under a low current, and such an increase of the operation voltage has not been recognized as a serious issue. In contrast, unlike such conventional structure LEDs, power LEDs are scheduled for use under a high current. Therefore, it is quite important for power LEDs to keep a low operation voltage from the viewpoint of the power consumption, reliability, lifetime, and the like. However, it has been believed extremely difficult practically to enhance the luminance without inviting an increase of the operation voltage. Consequently, it has been believed extremely difficult to enhance the light extraction efficiency of power LEDs further more.

BRIEF SUMMARY OF THE INVENTION

According to embodiments of the present invention, there is provided a semiconductor light emitting diode comprising:

epitaxial growth layers including a first conductive type clad layer, an active layer made of an InGaAlP compound semiconductor on said first conductive type clad layer to generate light, and a second conductive type clad layer formed on said active layer; and a transparent first conductive type GaP substrate made of GaP with a thickness of equal to or more than 150 μm and having a first surface, said first surface having an area equal to or wider than 0.1 $mm^2$ and bonded to a bonding surface of said first conductive type clad layer via no layer or via a bond layer, an area of said bonding surface of said first conductive type clad layer being smaller than said first surface of said substrate to locally expose said first surface or said bond layer.

According to embodiments of the present invention, there is further provided a semiconductor light emitting diode comprising:

epitaxial growth layers including a first conductive type clad layer, an active layer made of an InGaAlP compound semiconductor on said first conductive type clad layer to generate light, and a second conductive type clad layer formed on said active layer;

a transparent first conductive type semiconductor substrate with a thickness of equal to or more than 150 μm being transparent to light from said active layer and having a first surface and second surface opposite to each other, said first surface having an area equal to or wider than 0.1 $mm^2$ and bonded to a bonding surface of said first conductive type clad layer via no layer or via a bond layer, an area of said bonding surface of said first conductive type clad layer being smaller than said first surface of said substrate to locally expose said first surface or said bond layer, said light being extracted from the side of said second conductive type clad layer;

a first electrode formed on said second surface of said substrate to reflect said light from said active layer; and a second electrode formed on said second conductive type clad layer.

DETAILED DESCRIPTION OF THE INVENTION

Explained below are embodiments of the invention with reference to the drawings. One of features of the semiconductor light emitting diode according to the embodiments lies in locally removing epitaxial growth layers 103 through 108 by etching and thereby exposing a part of the bond layer 102. As a result, light extraction efficiency can be enhanced without inviting substantial increase of the operation voltage. Hereunder, three embodiments will be explained.

(First Embodiment)

Figure 2:
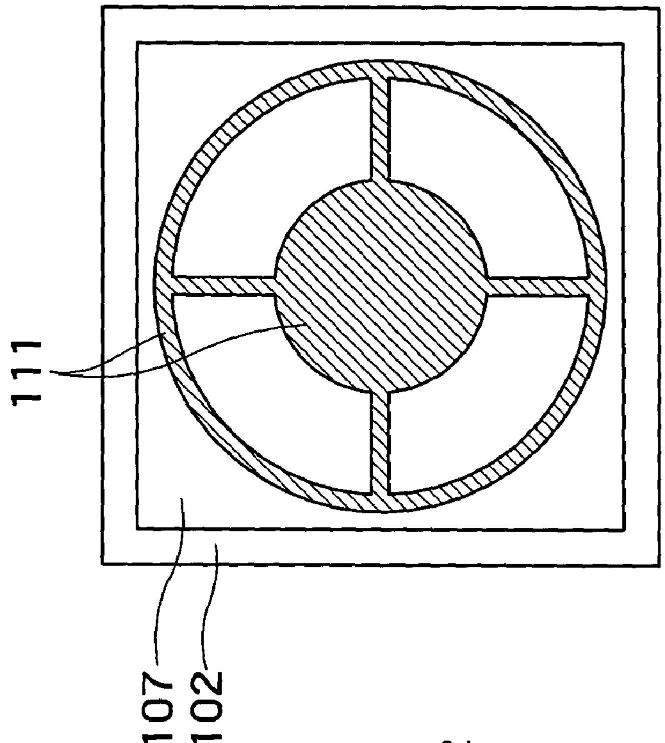
FIG. 2 is a top plan view of the semiconductor light emitting diode according to the first embodiment.
Figure 1:
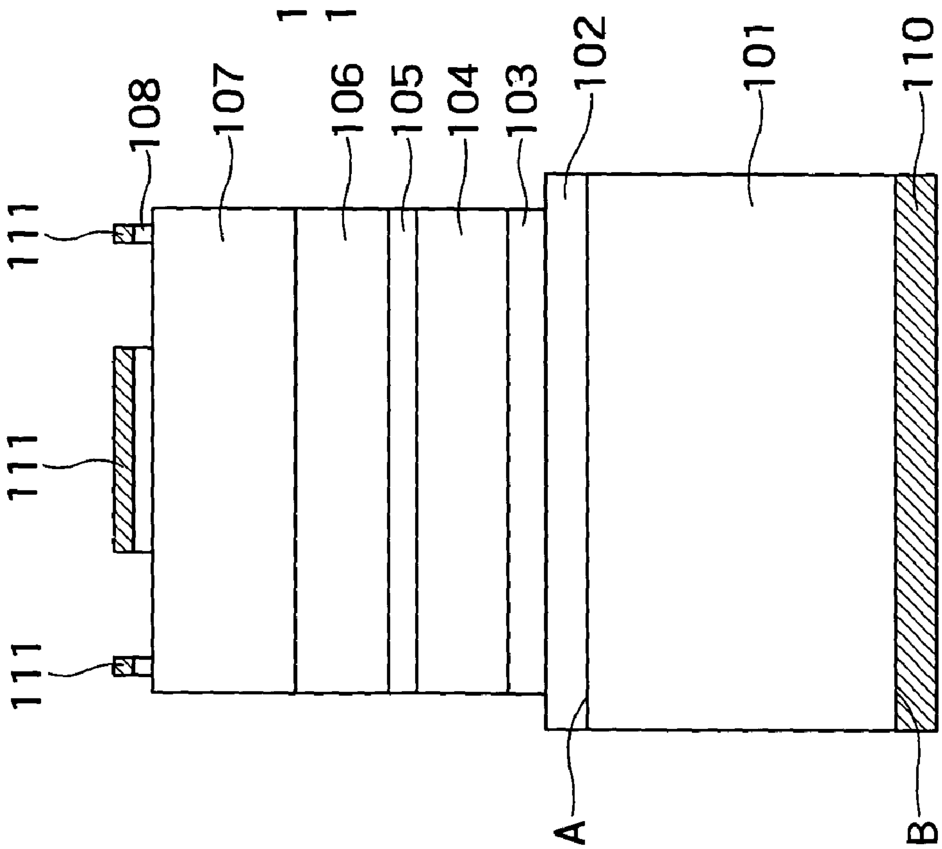
FIG. 1 is a cross-sectional view of a semiconductor light emitting diode according to the first embodiment of the invention.

FIGS. 1 and 2 show a semiconductor light emitting diode according to the first embodiment of the invention. FIG. 1 is a cross-sectional view thereof, and FIG. 2 is a top plan view. On an inner surface A of a 300 μm thick transparent p-type GaP substrate 101, sequentially formed are: a p-type GaP bond layer 102; p-type InGaP bond layer 103; p-type clad layer 104 of InAlP; active layer 105 having a MQW structure including p-type InGaAlP well layers; n-type clad layer 106 of InAlP; and current diffusion layer 107 of n-type InGaAlP. On a location of the current diffusion layer 107, an n-type contact layer 108 of GaAs is formed. On the n-type contact layer 108, an n-side electrode 111 is formed as one of electrodes. A p-side electrode 110 as the other electrode is formed on the bottom surface of the transparent p-type GaP substrate 101. In the diode shown in FIG. 1, thickness of the p-type GaP bond layer 102 is 0.05 μm, and thickness of the epitaxial growth layers 103–108 is several μm. However, they are illustrated in a modified scale for easier explanation.

The transparent p-type GaP substrate 101 is a rectangular solid that is 550 μm wide (W), 550 μm length (L) and 300 μm high (H) from the inner surface (first surface) A to the outer surface (second surface) B. Area of the inner surface A is approximately 0.3 $mm^2$. The diode of FIG. 1 uses such a large transparent substrate 101, and it can be supplied with a current as large as exceeding 50 mA by lowering the heat resistance of the package. This type of diode is called a power LED.

In the power LED of FIG. 1, a current is injected into the active layer 105 by the p-side electrode 110 and the n-side electrode 111. Responsively, red light is emitted from the active layer 105, and this light is extracted from the top in the figure (from the side of the n-type clad layer 106). In greater detail, light from the active layer 105 is emitted mainly to the upper and lower directions in the figure. The light emitted upward in the figure is extracted directly from the top. The light emitted downward from the active layer 105 passes through the GaP substrate 101, and then it is reflected upward by the p-side electrode 110, and extracted from the top. This is because the transparent p-type GaP substrate 101 is transparent to red light emitted from the active layer 105 in the power LED of FIG. 1. In order to extract light efficiently from the top, the n-side electrode 111 made of an opaque metal is formed to occupy a small area as shown in FIG. 2. More specifically, in this embodiment, the size of the inner portion of the n-side electrode 11 of FIG. 2 is 120 μmϕ. In addition, the n-side electrode 111 has a thin-line electrode structure as shown in FIG. 2 in order to distribute a large current uniformly over the entire area of the active layer 105. Width of the thin-line structure of the n-side electrode 111 is 3 to 5 μm. For the purpose of reducing absorption of light from the active layer 105, the n-type GaAs contact layer 108 is also etched into a predetermined configuration. On the other hand, the p-side electrode 110 is formed over the substantially entire area of the outer surface B of the transparent p-type GaP substrate in order to lower the operation voltage.

One of features of the power LED of FIG. 1 lies in limiting the area of the epitaxial growth layers 103 through 108 to be smaller than the area of the inner surface A of the substrate 101 and in bonding the inner surface A and the p-type clad layer 104 at the central portion of the inner surface A via the bond layers 102, 103 to expose the outer circumference of he bond layer 102. That is, in the power LED of FIG. 1, the epitaxial growth layers 103 through 108 are partly removed from above the outer circumference of the transparent p-type GaP substrate 101 (including the GaP bond layer 102) by a width of approximately 35 μm. Therefore, while the area of the inner surface A of the transparent p-type GaP substrate 101 becomes $550\times550\cong3.0\times10^{5}$ $\mu m^2$, the area of the epitaxial growth layer 103 through 108 becomes $480\times480\cong2.3\times10^{5}$ $\mu m^2$. In other words, in the power LED of FIG. 1, the coverage of the epitaxial growth layers 103 through 108 over the area of the inner surface A of the transparent p-type GaP substrate 101 is 75%. As a result, light extraction efficiency is high as explained later.

A manufacturing method of the power LED of FIG. 1 is briefly explained below.

(1) First of all, the p-type GaP bond layer 102 is formed by MOCVD on the transparent p-type GaP substrate 101 having the diameter of 2 inches (approximately 5 cm).

(2) On the other hand, on an opaque GaAs substrate (not shown) having the diameter of 2 inches, the n-type contact layer 108, current diffusion layer 107, n-type clad layer 106, active layer 105, p-type clad layer 104 and p-type InGaP bond layer 103 are formed sequentially. The epitaxial growth layers 103–108 are made of InGaAlP compound semiconductors and are lattice-matching with the GaAs substrate.

(3) After that, the p-type GaP bond layer 102 on the transparent p-type GaP substrate 101 and the p-type InGaP bond layer 103 of the epitaxial growth layers 103–108 are bonded. Thereafter, the opaque GaAs substrate is removed. It should be noted that the epitaxial growth layers 103–108 made of InGaAlP semiconductors and the transparent p-type GaP substrate 101 does not match in lattice. Therefore, it is extremely difficult to form the epitaxial growth layers 103–108 directly on the transparent p-type GaP substrate 101.

(4) Subsequently, preparatory mesas are formed in the epitaxial growth layers 103–108 on the p-type GaP bond layer 102, and individual diode portions are shaped as shown in FIG. 1. Forming the preparatory mesas in portions of individual diodes before separation by dicing or scribing contributes to higher dimensional accuracy. Thereafter, once the 2-inch substrate 101 is separated to individual diodes 550 μm long each side by dicing or scribing and each diode is processed to a predetermined shape, the diode of FIG. 1 is completed.

Figure 8:
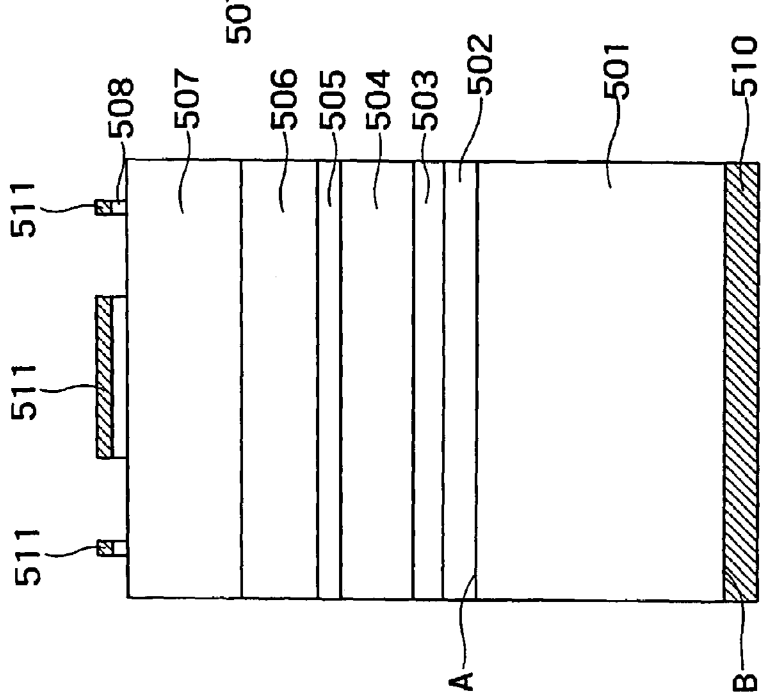
FIG. 8 is a cross-sectional view of a conventional power LED.

In the power LED of FIG. 1 made by the above 10 explained manufacturing method, since the epitaxial growth layers 103–108 are partly removed from the circumferential portion of the transparent p-type GaP substrate 101 (including the p-type GaP bond layer 102) such that the coverage of the epitaxial growth layers 103–108 over the area of the inner surface A of the transparent p-type GaP substrate 101 becomes 75%, light extraction efficiency from the top (main emission surface) of the diode can be enhanced. More specifically, according to an experiment by the Inventor, light extraction efficiency could be enhanced to approximately 1.2 times that of the conventional diode (FIG. 8). The Inventor presumes its reason as explained below.

In the diode of FIG. 1, light emitted downward in the figure from the active layer 105 passes through the transparent electrode 101, and it is reflected upward by the p-side electrode 110 as already explained. Then, light traveling upward passes again through the active layer 105. However, when the light passes through the active layer 105, part of this light is absorbed by the active layer 105. That is, the active layer 105 behaves as a hindrance against extraction of the main emission light. Taking it into account, an outer circumferential portion is removed from the active layer 105 that behaves as the hindrance. In this manner, part of the reflected light reflected upward by the p-side electrode 110 and reaching the outer circumferential portion travels upward without passing the active layer 105. Therefore, absorption of light by the active layer 105 is reduced, and the light extraction efficiency is enhanced. This is the Inventor's presumption. The inventor also presumes that another reason lies in the mechanism in which the reduction of the area of the active layer to flow the current in the narrowed area contributes to decreasing the current (carrier) component consumed by non-radiative carrier recombination and enhancing the ratio of radiative carrier recombination relative to the injected current (carrier).

Furthermore, the power LED of FIG. 1 can maintain high heat radiation. That is, thermal conductivity of the GaP substrate 101 of FIG. 1 is approximately 0.77 W/cm/deg higher the thermal conductivity, approximately 0.47 W/cm/deg, of the GaAs substrate (not shown) to be separated as explained above. In addition, size of the GaP substrate 101 is as large as 550 μm (W)×550 μm (L)×300 μm (H) equally to that of the conventional power LED (FIG. 8). Therefore, the power LED of FIG. 1 can maintain a high heat radiation property equivalent to that of the conventional power LED (FIG. 8).

The idea of partly removing the epitaxial growth layers 103–108 in the power LED may be beyond contemplation by ordinary skilled persons in the art because it has been the general belief that reduction of the area of the epitaxial growth layers 103–108 and hence the area of the active layer 105 invites an increase of the operation voltage. That is, as already explained, the power LED is designed for use under a high current, it is extremely important that the operation voltage is low from the viewpoint of power consumption, reliability, lifetime, and so on. However, reduction of the area of the active layer 105 may invite an increase of the operation voltage. Consequently, no structures nevertheless diminishing the area of the epitaxial growth layers 103–108 have not been employed in power LEDs from the viewpoint of preventing an increase of the operation voltage.

However, the Inventor once failed in etching in a manufacturing process for obtaining a conventional power LED as shown in FIG. 8, and obtained a sample as shown in FIG. 1 in which the epitaxial growth layers 103–108 were smaller than the substrate 101. The Inventor first regarded this sample as being high in operation voltage and not usable. However, when we actually measured the sample, we found that the increase of the operation voltage was in a level not adversely affecting the operation of the product. The Inventor also found that the sample exhibited high light extraction efficiency. Based upon the knowledge thus obtained, the Inventor manufactured a sample having the coverage of 75% as shown in FIG. 1. As a result, the inventor could confirm an operation voltage Vf around 2.02 V (see FIG. 3) not different from that of the conventional power LED (FIG. 8) so much. Furthermore, since the operation voltage Vf did not increase, no deterioration in reliability was found. The Inventor assumes that the large area and volume of the substrate 101 reduced influences of the small epitaxial growth layers 103–108 to the operation voltage and led to the aforementioned phenomena. The Inventor also assumes that, in the diode including epitaxial growth layers 103–108 made of InGaAlP semiconductors and the substrate 101 made of GaP, the substrate 101 has a wider band gap than the epitaxial growth layer 103–108, and the current flowing from the substrate 101 to the epitaxial growth layers 103–108 is not diminished even when the epitaxial growth layers is smaller.

As such, in the power LED of FIG. 1, light extraction efficiency can be enhanced without inviting an increase of the operation voltage or a decrease of the reliability.

Figure 3:
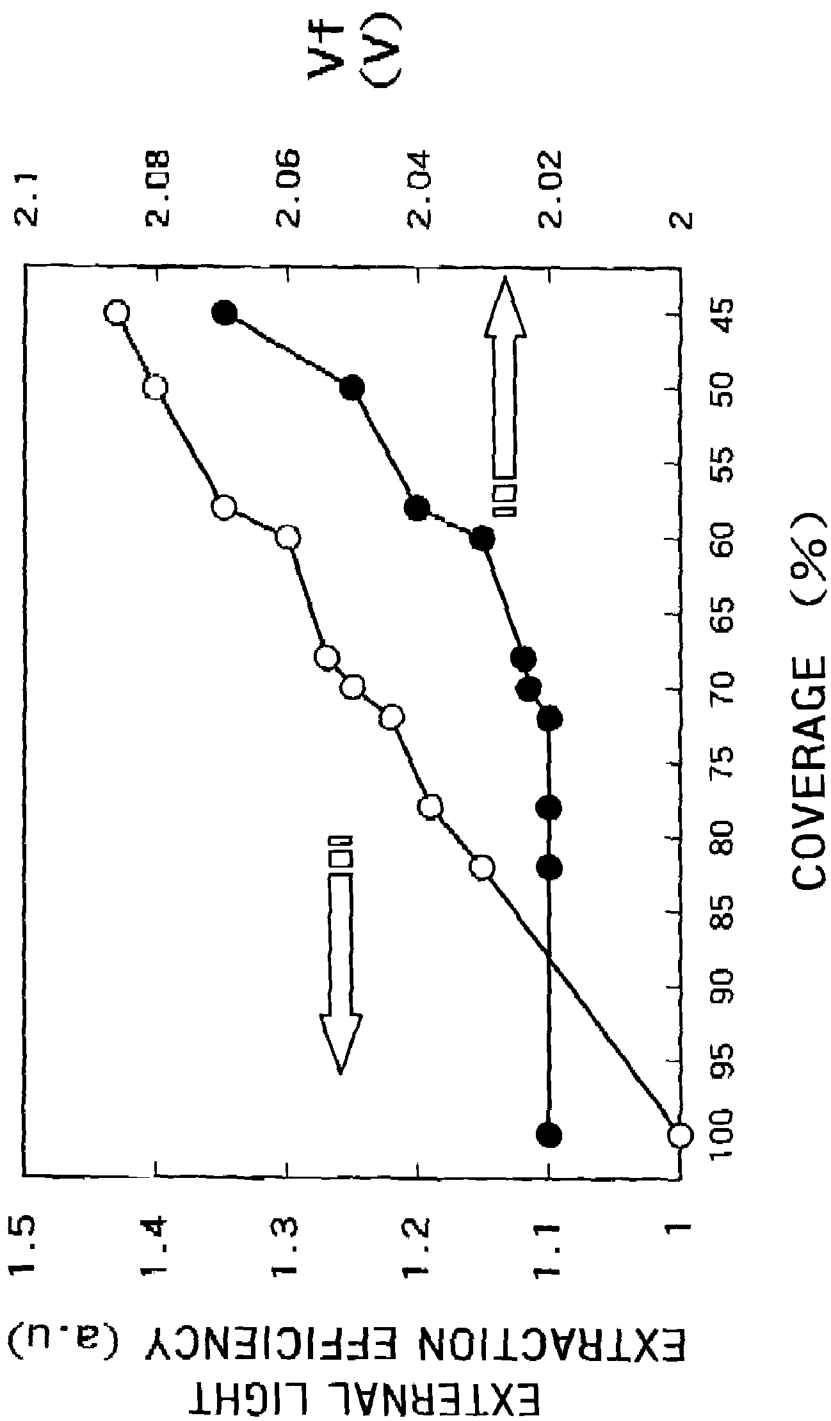
FIG. 3 is a diagram showing relations among the coverage, external light extraction efficiency and operation voltage Vf in the semiconductor light emitting diode according to the first embodiment.

Next made is a review on the range of coverage of the active layer 105 relative to the area of the inner surface A of the transparent p-type GaP substrate 101 with reference to FIG. 3. The power LED of FIG. 1 has been explained as partly removing the epitaxial growth layers 103–108 such that the coverage of the epitaxial growth layers 103–108 relative to the area of the inner surface A of the transparent p-type GaP electrode 101 becomes 75%. However, the coverage can be changed by changing the area to be removed. A review is made hereunder on the appropriate range of the coverage.

FIG. 3 is a diagram showing values of external light extraction efficiency and values of operation voltage Vf in response to changes of the coverage. In FIG. 3, white circles show values of external light extraction efficiency taken along the left vertical axis. The efficiency is a value relative to the efficiency of 1.0 obtained by the coverage of 100%. Black circles in FIG. 3 show values of operation voltage Vf taken along the right vertical axis. The horizontal axis shows the coverage (in %). In case the coverage is 100%, the power LED has the structure of conventional power LED shown in FIG. 8.

As shown by white circles in FIG. 3, when the coverage decreases to 90% or less, external light extraction efficiency increases to approximately 1.1 times that of the conventional power LED (FIG. 8). When the coverage decreases to 80% or less, external light extraction efficiency further increases. In the range where the coverage is 45% or more, light extraction increases as the coverage decreases. On the other hand, as shown by black circles, once the coverage decreases below 70%, the operation voltage Vf gradually increases. In the region where the coverage is equal to or more than 70%, almost no increase occurs in the operation voltage Vf. If the coverage is equal to or more than 60%, serious problems do not occur in the operation as the product. From the data of the external light extraction efficiency (white circles) and the operation voltage Vf (black circles) of FIG. 2, it is appreciated that the coverage in the range from the lower limit of 60% to the upper limit of 90%, more preferably in the range from the upper limit of 70% to the upper limit of 80%, yields good results.

In the power LED according to the invention explained above, explanation has been made as using it under a large current in its normal use. If the power LED is used under a low current, the problem of an increase of the operation voltage is less likely to occur. Therefore, the coverage may be reduced below 60%, thinking a great deal of the light extraction efficiency.

(Second Embodiment)

Figure 5:
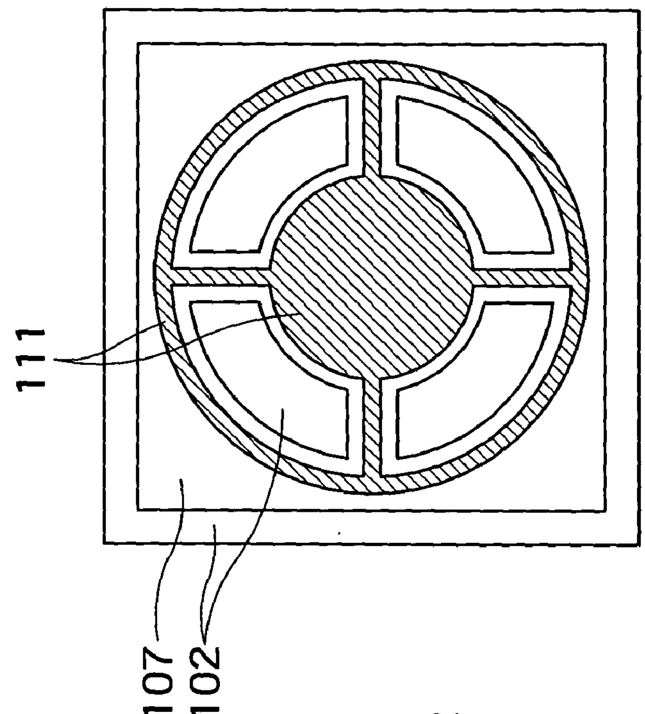
FIG. 5 is a top plan view of the semiconductor light emitting diode according to the second embodiment.
Figure 4:
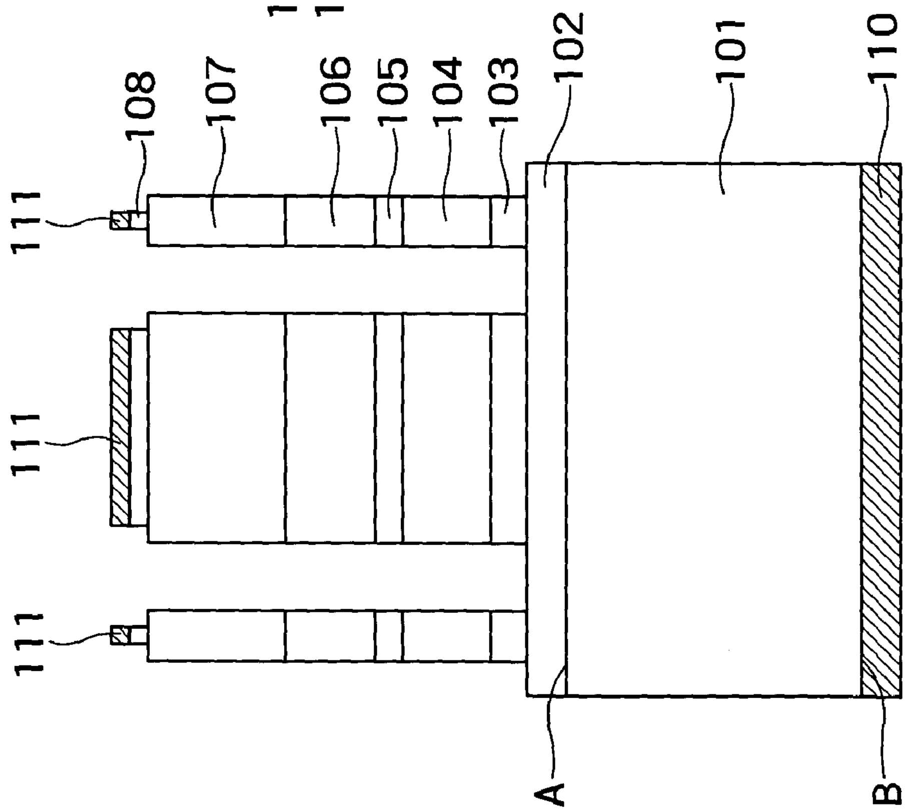
FIG. 4 is a cross-sectional view of a semiconductor light emitting diode according to the second embodiment of the invention.

FIGS. 4 and 5 show a semiconductor light emitting diode (power LED) according to the second embodiment of the invention. FIG. 4 is a cross-sectional view thereof, and FIG. 5 is its top plan view. Operations and effects of the diode derived from its structure are the same as those of the first embodiment (FIG. 1), and identical or equivalent components to those of the first embodiment are labeled with common reference numerals. A difference of the second embodiment from the first embodiment lies in that a groove is formed in the epitaxial growth layers 103–108 to expose the p-type GaP bond layer 102 at the bottom of the groove in addition to exposing the outer circumference of the p-type GaP bond layer 102. In this manner, it is possible to prevent light absorption in the portion in which the current injection effect is weak, and it is thereby possible to extract emitted light from the active layer 105 efficiently to increase the light extraction efficiency further more.

The structure of the diode shown in FIGS. 4 and 5 is explained below in greater detail. In the top plan view of FIG. 5, size of the current diffusion layer 107 is 480 μm wide and 480 μm length. Size of the inner part of the n-side electrode 111 formed on the current diffusion layer 107 is 120 μmϕ. Width of the outer thin-line portion of the n-side electrode 111 is 3 to 5 μm. In the diode of FIG. 5, part of the multi-layered structure 103–107 is removed by etching to maintain the surrounding 3 to 5 μm and expose the central region of the p-type GaP bond layer 102. A current from the n-side electrode 111 having the thin-line structure diffuses only over the width approximately equal to the thin-line width and flows into the active layer 105. In the remainder portion of the active layer 105, the current injection effect is weak. Tanking it into account, the portion with a weak current injection effect is etched in the diode of FIG. 5. Since the etched portion of the active layer 105 emits almost no light by nature, the etching does not decrease the luminance. Instead, removal of the non-emitting portion of the active layer 105 rather prevents light absorption by that portion of the active layer 105, and enables efficient extraction of light from the active layer 105 from under the n-side electrode 111. As a result, the second embodiment can increase the light extraction efficiency further more.

In the diode of FIGS. 4 and 5 explained above, the n-side electrode 111 has the one-fold thin-line portion formed concentrically with the central portion thereof. However, a two-fold or three-fold thin-line portion may be formed. If a two-fold thin-line portion is formed, another part of the p-type GaP bond layer 102 between first-fold and second-fold thin-line electrodes can be exposed. However, a width approximately equal to the thin-line electrode is preferably maintained unetched around the thin-line electrode similarly to the diode of FIG. 4.

(Third Embodiment)

Figure 7:
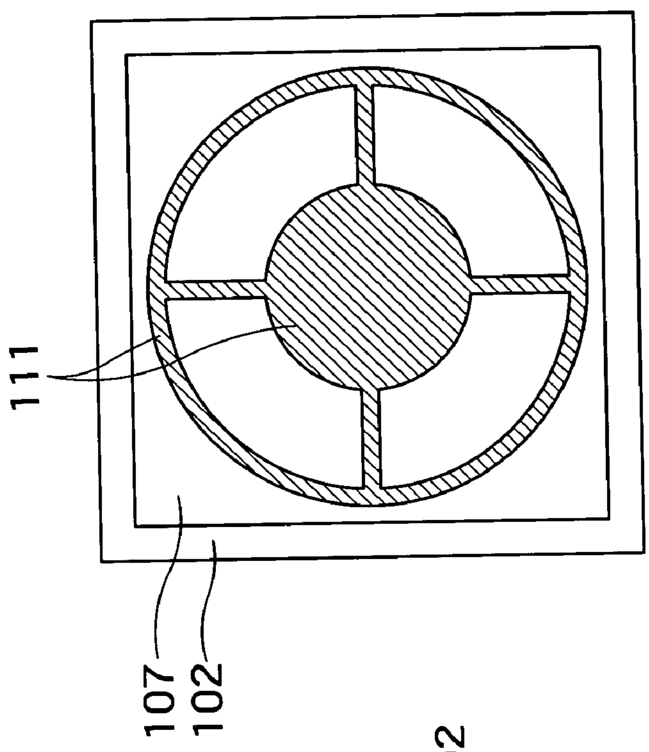
FIG. 7 is a top plan view of the semiconductor light emitting diode according to the third embodiment.
Figure 6:
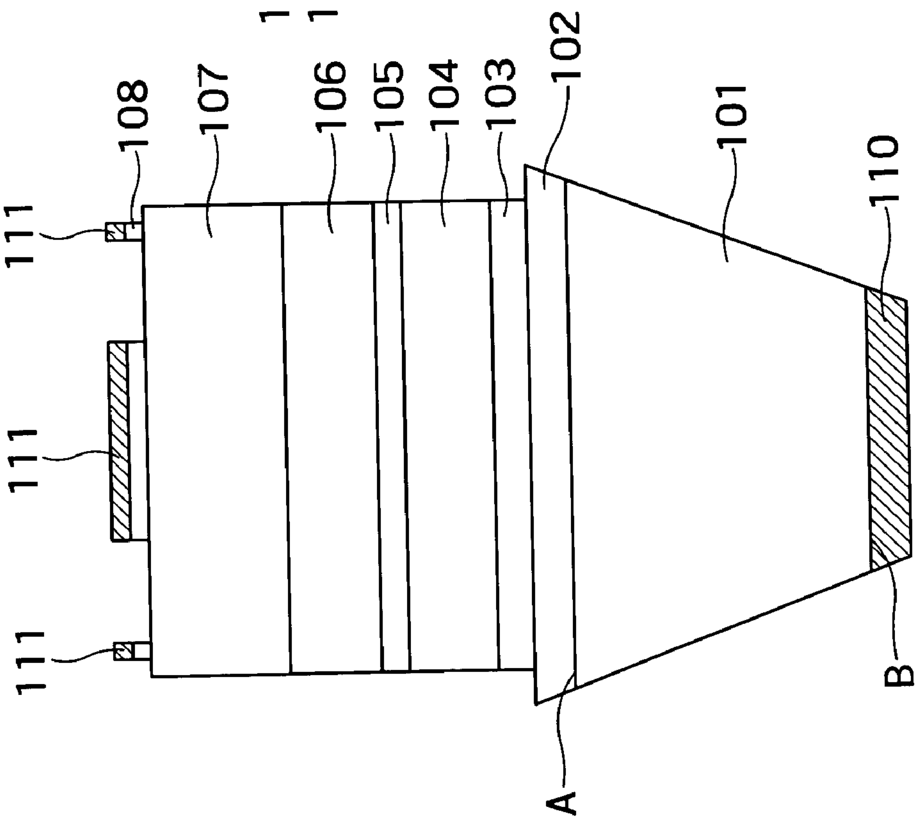
FIG. 6 is a cross-sectional view of a semiconductor light emitting diode according to the third embodiment of the invention.
Figure 9:
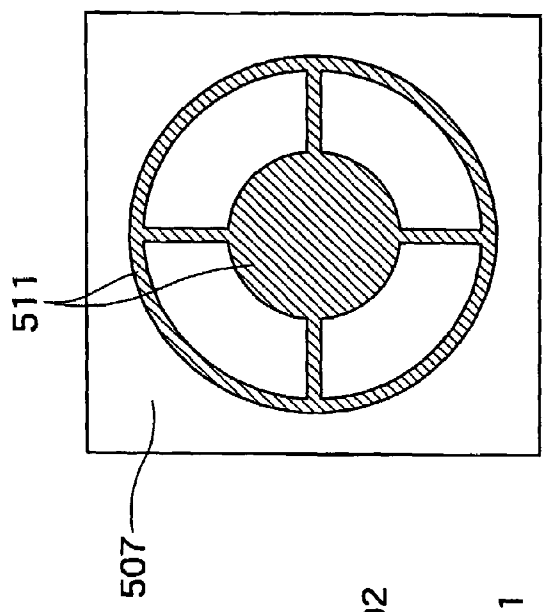
FIG. 9 is a top plan view of the conventional power LED.

FIGS. 6 and 7 show a semiconductor light emitting diode (power LED) according to the third embodiment of the invention. FIG. 6 is a cross-sectional view thereof, and FIG. 7 is its top plan view. Operations and effects of the diode derived from its structure are the same as those of the first embodiment (FIG. 1), and identical or equivalent components to those of the first embodiment are labeled with common reference numerals. A difference from the first embodiment lies in the tapered shape of the side surface of the p-type GaP substrate 101 as apparently shown in FIG. 6. Thus, the third embodiment can enhance the light extraction efficiency further more.

In the embodiments explained above, the transparent p-type GaP substrate 101 is bonded to the p-type clad layer 104 via the bond layers 102, 103. However, they can be directly bonded as well to expose a part of the inner surface A.

Furthermore, in the embodiments explained above, the transparent p-type GaP substrate 101 is sized such that the area of the inner surface A becomes approximately 0.3 $mm^2$. Any size not smaller than 0.1 $mm^2$, or preferably not smaller than 0.2 $mm^2$, is also acceptable for effectively using the invention. Moreover, although the transparent p-type GaP substrate 101 has been explained as being 300 μm thick, any thickness not less than 150 μm is acceptable for using the invention effectively. In addition, if the transparent p-type GaP substrate 101 is an approximately rectangular solid that is sized not less than 350 μm in width and not less than 350 in length, the invention can be used more effectively from the viewpoint of the manufacturing process. Such a large-scaled LED is operative under a current as large as surpassing 50 mA.

Further, in the embodiments explained above, the p-type and the n-type may be inverted as well. Furthermore, InGaAlP compound semiconductors used as epitaxial growth layers 103–108 and GaP used as the substrate 101 may be replaced by other materials.

Additional advantages and modifications will readily occur to those skilled in the art. Therefore, the invention in its broader aspects is not limited to the specific details and representative embodiments shown and described herein. Accordingly, various modifications may be made without departing from the spirit or scope of general inventive concept as defined by the appended claims and their equivalents.

What is claimed is:

1. A semiconductor light emitting diode comprising:

epitaxial growth layers including a first conductive type clad layer, an active layer made of an InGaAlP compound semiconductor on said first conductive type clad layer to generate light, and a second conductive type clad layer formed on said active layer; and a transparent first conductive type GaP substrate having a first surface, and bonded to a bonding surface of said first conductive type clad layer via no layer or via a bond layer, an area of said bonding surface of said first conductive type clad layer being smaller than said first surface of said substrate to locally expose said first surface or said bond layer.

2. A semiconductor light emitting diode according to claim 1 wherein said substrate is an approximately rectangular solid at least 350 μm wide and at least 350 μm long.

3. A semiconductor light emitting diode according to claim 1 wherein said first conductive type clad layer of said epitaxial growth layers is bonded to a central portion of said first surface of said substrate to expose an outer circumferential part of said first surface or said bond layer.

4. A semiconductor light emitting diode according to claim 3 wherein a groove is formed in said epitaxial growth layer to expose part of said first surface or said bond layer at the bottom of said groove.

5. A semiconductor light emitting diode according to claim 1 wherein the coverage of said epitaxial growth layers relative to said area of said first surface of said substrate is in the range not less than 60% and not more than 90%.

6. A semiconductor light emitting diode according to claim 1 wherein the coverage of said epitaxial growth layers relative to said area of said first surface of said substrate is in the range not less than 70% and not more than 80%.

7. A semiconductor light emitting diode according to claim 1 further comprising:

a first electrode formed on a second surface of said substrate to reflect said light from said active layer, said second surface being opposite to said first surface; and a second electrode formed on said second conductive type clad layer, wherein light is extracted from the side of said second conductive type clad layer.

8. A semiconductor light emitting diode comprising:

epitaxial growth layers including a first conductive type clad layer, an active layer made of an InGaAlP compound semiconductor on said first conductive type clad layer to generate light, and a second conductive type clad layer formed on said active layer;

a transparent first conductive type semiconductor substrate being transparent to light from said active layer and having a first surface and second surface opposite to each other, said first surface being bonded to a bonding surface of said first conductive type clad layer via no layer or via a bond layer, an area of said bonding surface of said first conductive type clad layer being smaller than said first surface of said substrate to locally expose said first surface or said bond layer, said light being extracted from the side of said second conductive type clad layer;

a first electrode formed on said second surface of said substrate to reflect said light from said active layer; and a second electrode formed on said second conductive type clad layer.

9. A semiconductor light emitting diode according to claim 8 wherein said substrate is an approximately rectangular solid at least 350 μm wide and at least 350 μm long.

10. A semiconductor light emitting diode according to claim 8 wherein said first conductive type clad layer of said epitaxial growth layers is bonded to a central portion of said first surface of said substrate to expose an outer circumferential part of said first surface or said bond layer.

11. A semiconductor light emitting diode according to claim 10 wherein a groove is formed in the epitaxial growth layer to expose part of said first surface or said bond layer at the bottom of said groove.

12. A semiconductor light emitting diode according to claim 8 wherein the coverage of said epitaxial growth layers relative to said area of said first surface of said substrate is in the range not less than 60% and not more than 90%.

13. A semiconductor light emitting diode according to claim 8 wherein the coverage of said epitaxial growth layers relative to said area of said first surface of said substrate is in the range not less than 70% and not more than 80%.

14. A semiconductor light emitting diode according to claim 1, wherein said transparent first conductive type GaP substrate is made of GaP with a thickness of equal to or more than 150 μm.

15. A semiconductor light emitting diode according to claim 1, wherein said first surface has an area equal to or wider than 0.1 $mm^2$.

16. A semiconductor light emitting diode according to claim 8, wherein said transparent first conductive type semiconductor substrate has a thickness of equal to or more than 150 μm; and said first surface has an area equal to or wider than 0.1 $mm^2$.

17. A semiconductor light emitting diode according to claim 1, wherein an area of said first surface of the GaP substrate is larger than an area of a second surface arranged opposite to said first surface of the GaP substrate.

18. A semiconductor light emitting diode according to claim 8, wherein an area of said first surface of the GaP substrate is larger than an area of said second surface of the GaP substrate.

19. A semiconductor light emitting diode according to claim 1, wherein an area of said active layer is smaller than an area of said GaP substrate.

20. A semiconductor light emitting diode according to claim 8, wherein an area of said active layer is smaller than an area of said GaP substrate.

* * * * *